United States Patent
Nygaard, Jr.

[19]

[11] Patent Number: 6,131,175
[45] Date of Patent: Oct. 10, 2000

[54] AUTOMATIC SELECTION OF A SPECIAL MODE OF OPERATION IN MULTI-CHANNEL TEST EQUIPMENT

[75] Inventor: Richard A. Nygaard, Jr., Colorado Springs, Colo.

[73] Assignee: Hewlett Packard Co., Palo Alto, Calif.

[21] Appl. No.: 09/015,738

[22] Filed: Jan. 29, 1998

[51] Int. Cl.[7] .................................................. G01R 31/28
[52] U.S. Cl. .................................... 714/739; 324/756
[58] Field of Search .................................... 714/739, 740, 714/742, 745, 735, 25, 27, 32, 37, 39, 48; 324/756, 757, 759, 754; 364/550, 551.01

[56] References Cited

U.S. PATENT DOCUMENTS

| | | | |
|---|---|---|---|
| 3,956,601 | 5/1976 | Harris et al. | 179/175.3 R |
| 4,293,925 | 10/1981 | Haag et al. | 364/900 |
| 4,455,624 | 6/1984 | Haag et al. | 364/900 |
| 4,524,444 | 6/1985 | Efron et al. | 371/24 |
| 4,623,837 | 11/1986 | Efron et al. | 324/77 R |
| 4,807,147 | 2/1989 | Halbert et al. | 364/487 |
| 4,862,067 | 8/1989 | Brune et al. | 324/73 R |
| 5,282,213 | 1/1994 | Leigh et al. | 371/22.1 |
| 5,659,255 | 8/1997 | Strid et al. | 324/754 |

*Primary Examiner*—Nadeem Iqbal
*Attorney, Agent, or Firm*—Edward L. Miller

[57] ABSTRACT

Multi-channel measurement equipment enters or performs a special mode of operation in response to an arbitrarily chosen probe being momentarily touched to a special terminal. A signal identifiable by its uncommon properties is present at the special terminal. The uncommon signal is generated by a suitable circuit, which may be similar to a pseudo random sequence generator. Each channel is equipped with a recognition circuit that recognizes the presence of the uncommon signal. The recognition circuits each receive a copy of the uncommon ID signal, and the task of recognition is performed by pattern matching over time. To enter or perform the special mode the operator touches the probe to the special terminal. After a suitable but brief period of time the recognition circuit for that probe produces an output that indicates recognition. The measurement equipment responds by entering or performing the special mode of operation. The special mode of operation may be ended by touching again touching the probe to the special terminal, by some other manual action, such as a keystroke or mouse click, or by some other event within the context of the special mode.

7 Claims, 5 Drawing Sheets

AUTOMATIC SELECTION OF A SPECIAL MODE OF OPERATION IN MULTI-CHANNEL TEST EQUIPMENT

REFERENCE TO RELATED APPLICATION

This application is related to the subject matter of an application entitled MULTIPLE PROBE TEST EQUIPMENT WITH CHANNEL IDENIIFICATION, filed Dec. 23, 1997 by Richard A. Nygaard, Jr. and assigned to Hewlett-Packard Co. In brief, that application describes how to identify what channel an arbitrary probe is associated with, by touching that probe to an ID terminal, recognizing that a probe has been connected to the ID terminal, determining the channel associated with that probe, and then displaying the associated channel's identification or other caption information. The present application is not concerned with identifying probe-to-channel correspondence per se, but rather with automatically instituting a special use for an arbitrary channel given the prior ability to recognize that its associated probe has been momentarily connected to a special terminal, which prior ability is taught in that aforementioned application. For the sake of brevity, therefore, the aforementioned application is hereby incorporated herein by reference.

BACKGROUND AND SUMMARY OF THE INVENTION

Certain types of test equipment, such as logic analyzers and timing analyzers, have a large number of input data channels. The usual situation is for a number of channels to be grouped together as components of some measurable abstraction (such as addresses or data that are part of transactions on a bus). Each channel has an associated probe, and a result of such operation is a requirement that there be a known probe to signal correspondence, which is usually declared during set-up or configuration. There are other times, however, when a channel and its probe can be used as part of a measurement made in some mode not involving correspondence among multiple probes or channels. Say, for example, the test equipment were a logic analyzer, and some difficulty was being experienced in trying to set up and perform some measurements involving multiple channels. Someone suggests that perhaps a clock signal, or maybe some other necessary signal, is absent or abnormal. One could go get an oscilloscope and set it up to find out, or, as an example use of the invention, one could instead grab any probe (unused or otherwise), touch it to a particular (special) terminal on the front panel to invoke a single channel waveform display whose input is that channel, and then display the waveform for the signal of interest by moving the probe to a place where that signal is present. The single channel display mode of operation for that channel would remain in effect until cancelled by some affirmative action, such as an appropriate series of keystrokes on a keyboard, clicking a mouse button while a pointer is over a displayed legend, or perhaps by simply moving the probe tip to again touch the special terminal. The nature of the special mode (time domain waveform display versus, say, measurement of RMS value) may be fixed ahead of time or specified (say, in a menu) upon leaving the "normal" mode. Other special modes of operation include performance verification and a stimulus mode. The desired special mode of operation could also be specified by which of several corresponding terminals were touched by the probe. If any such terminal were touched with two probes, then each of the two corresponding channels would enter a special mode, and there may be a choice of whether to treat them as separate single channel measurements (which are possibly not of the same nature) or as one two channel measurement. In any event, considerable utility arises from being able to make a measurement in some special mode using whatever probe happens to be handy, and without having to know ahead of time what channel that probe corresponds to.

DESCRIPTION OF A PREFERRED EMBODIMENT

Before we commence a description of how to make and use the invention, the reader is reminded of the aforementioned incorporation by reference. That document describes the construction and operation of multi-channel test equipment having the capability of identifying which channel has had its probe touched to a special ID terminal. In brief, it may be done by having an ID signal generator produce a signal (e.g., a pseudo random digital pattern) which is then applied to one or more serial comparators which also receive the signals present on each of the channels. A match will occur only if a probe has been connected to the ID terminal, which is itself internally connected to and driven by the signal produced by the ID signal generator. There can either be one serial comparator for each channel, or a single serial comparator connected by multiplexing to a plurality of channels, or a mixture of these techniques. Whatever the architecture, when a match between the ID signal and the signal on a channel, it is possible to backtrack the correspondence evinced at that instant and determine, even for a probe that was initially chosen arbitrarily, which channel that arbitrarily chosen probe is associated with. The incorporated document then goes on to say how the probe-to-channel correspondence can be indicated, perhaps including an indication of caption information for the channel, such as a label and polarity and threshold settings.

The present disclosure deals with different results that may be accomplished, aside from indicating correspondence and caption information, given, as taught in the incorporated document, an existing ability to recognize that a probe arbitrarily chosen from among a plurality of probes is touching a special terminal. Accordingly, it will be assumed herein that how it is determined that an arbitrarily chosen probe from among a plurality of probes is touching an ID terminal is not an issue, and we shall concentrate instead on something that can be done once such a determination is made.

Figure 1:
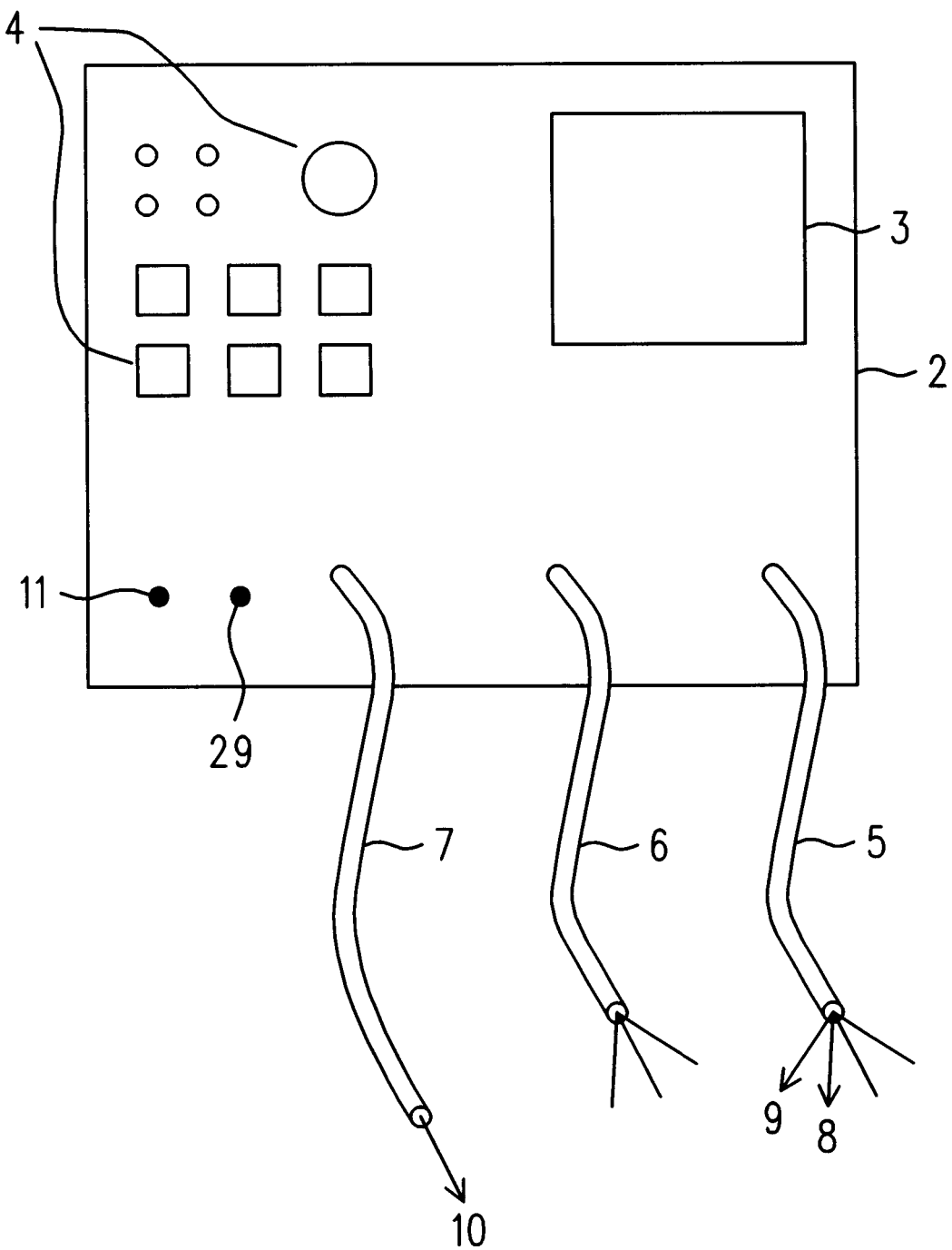
FIG. 1 is a simplified block diagram representation of a multi-channel data measurement apparatus, such as a logic analyzer, timing analyzer or multi-channel waveform recorder, and having a special front panel terminal to which an arbitrarily selected probe may be momentarily touched to cause the measurement apparatus to enter or perform a special mode of operation.

Refer now to FIG. 1, which is a simplified block form hardware diagram illustrating an environment 1 in which the invention is useful. That environment 1 includes a multi-channel instrument or item of test equipment 2 having a display 3 and various controls 4. Cables 5, 6 and 7 couple various probes 8, 9 and 10 to the multi-channel instrument 2. A variety of form factors may be present, including the conductors for several probes (8, 9) being bundled into a cable as shown with cables 5 and 6, or, where a cable 7 serves only a single probe 10. Also, we have shown the instrument 2 as being a single item, whereas it is entirely possible (as described in the incorporated document) that a computer running suitable software is interfaced to and controls a measurement box that carries the cables 5, 6 and 7, the display 3 is a monitor connected to the computer, and the controls 4 are the computer keyboard and a pointing device, such as a mouse.

Note the terminal 11 on the instrument 2. In the terminology of the incorporated document it would be the ID terminal. Herein we prefer a term that does not suggest the specific end purpose of determining probe to channel correspondence, in favor of our present purpose of entering or performing some special mode of operation for the instrument 2. For want of a better term (and since we neither know nor particularly care what that special mode might be) we shall call that terminal 11 a "special terminal". Naturally, in a specific case where the nature of the special mode is known, say, it initiates a single channel oscillographic display, the special terminal 11 might be called the "single channel terminal", or some such.

Figure 2:
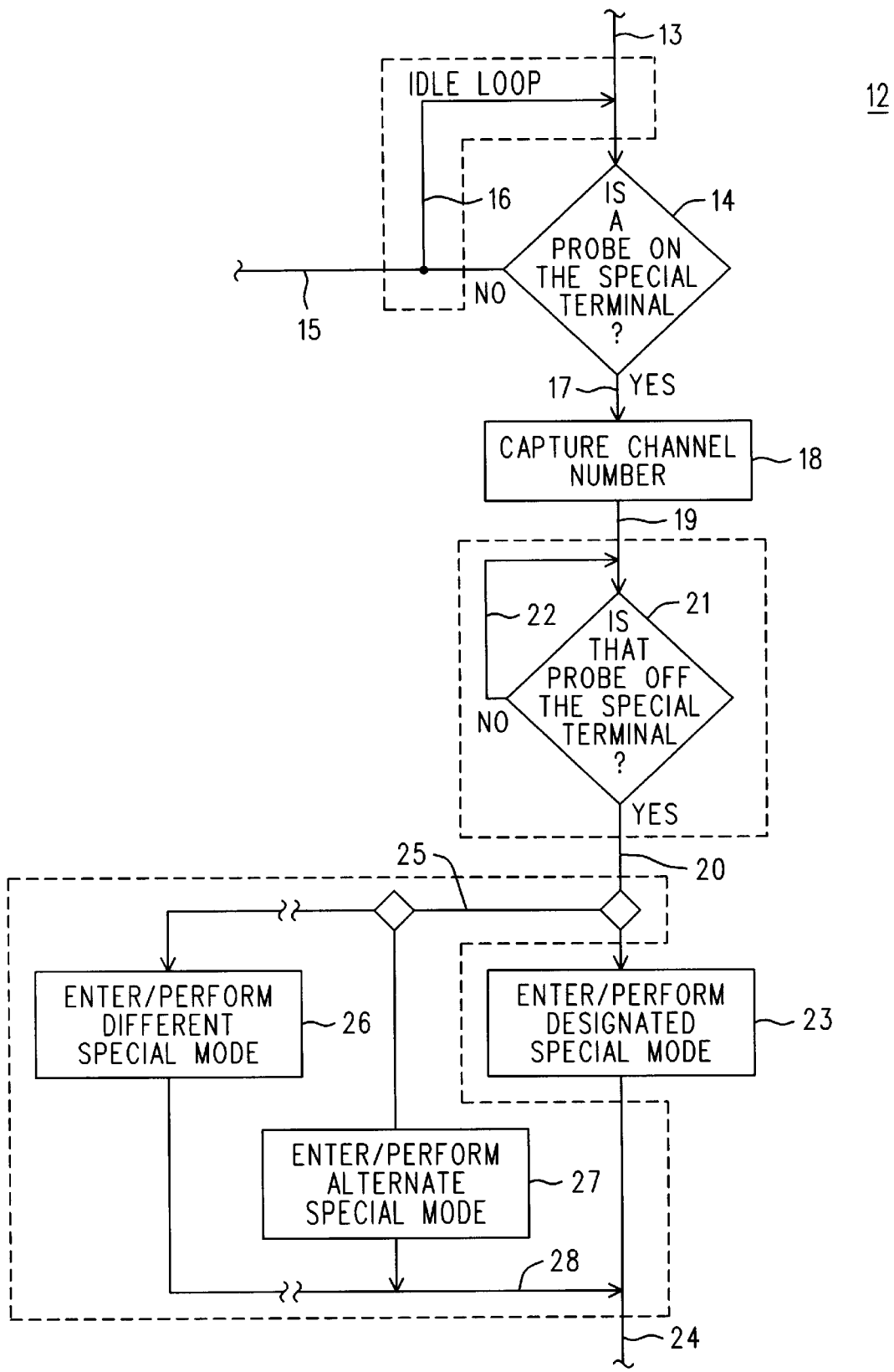
FIG. 2 is a simplified flow chart illustrating the aspect of internal operation of the internal circuitry of the block diagram of FIG. 1 that allows the apparatus to determine that it is to enter or perform the special mode.

Refer now to FIG. 2, wherein is shown a simplified flow chart 12 of the internal operation of an instance of multi-channel test equipment 2 that includes the ability to determine if an arbitrarily selected probe is on a special terminal 11, and if so, which channel it represents, and then enter or perform some designated special mode of operation.

It is fair to ask just whose activity the flow chart 12 represents. In the case where the instrument 2 is a single unified item (e.g., a traditional self-contained logic state analyzer or a traditional self-contained timing analyzer), then there is either a microprocessor or a state machine whose activities implement certain controlling algorithms. The activity of flow chart 12 is periodically executed (say, from about ten to one hundred times a second, or perhaps even more often) as part of that algorithmic activity, say, as part of an executive or oversight process that checks for keystrokes or other operation of the controls 4. In the case where instrument 2 comprises a programmed computer that controls a separate section of measurement electronics in response to user interaction with that programmed computer, then the preferred arrangement is for controlling algorithms in that measurement electronics to periodically execute the material of flow chart 12. Presumably the measurement electronics will be operating in conjunction with a suitable controlling program executing on the computer (to create the display and relay the settings of any "soft front panel controls" manipulated by the user) and will also be able to indicate to that controlling program that (a) either "a certain probe is touching special terminal 11", or that (b) "the measurement electronics is entering a special mode, and thus please treat the following data accordingly". In case (a) the controlling programming executing on the computer honors a request to establish a special mode by altering its own behavior and also instructing the measurement electronics to do likewise. In case (b) the measurement electronics enters the special mode on its own recognition that a probe is on the special terminal 11, and simply informs the controlling program of that fact so that it may cooperate by changing its behavior in any needed corresponding way. In either case (a) or case (b) the idea is that a different mode of operation is about to go into effect and some associated data will probably need to be displayed in a different and appropriate fashion.

To proceed, then, consider that flow chart 12 is periodically entered at location (or along path) 13, and that the next activity 14 is a decision that determines if a probe is touching the special terminal 11. If the answer is NO, then path 15 transitions to whatever activity is next. Path 16 is an alternative to path 15, and forms an idle loop which is left only when the answer to decision 14 is YES. This idle loop is appropriate when, for example, there is a dedicated state machine or processing mechanism whose sole or principal job is to respond to decision 14 as shown by flow chart 14. That is, that state machine or processing mechanism is free to wait in an idle loop because other processing resources (not shown) are taking care of other business that needs to be done, such as making the logic state or timing measurement.

If the answer to decision 14 is YES, then the next activity 18 is to capture the channel number corresponding to the probe that is touching the special terminal. For example, the channel number may be stored in a register, or in a known location in RAM.

The next activity is optional decision 21, reached by exit path 19 from activity 18. If the optional decision 21 is indeed absent, or is in another location, then its exit path 20 and path 19 are one and the same. The purpose of the optional decision 21 and its loop-back path 22 is to form an escapement mechanism in the event the special mode of operation is to be terminated by a another instance of contact of the probe to the special terminal 11. If that is the case, the probe must first be removed before there can be a detection of a second instance of contact. The purpose of the escapement mechanism is to enforce that removal. It will be noted, however, that the actual location of such an escapement mechanism relative to other activities is somewhat a matter of choice. For example, if there were but one overall type of special mode, then the escapement mechanism could be interior to activities within that mode. If there were different special modes reached according to some selection mechanism subsequent to determining that the probe is on the special terminal 11, then it could still be the case that an escapement is part of each special mode, although that implies multiple instances of the detection of a second instance of contact; one within the context of each special mode. It is more efficient to locate the escapement ahead of any such branching to various special modes, as is shown in the figure.

Even if there were but one special mode and it is terminated by keystrokes or other methods not involving the probe, and although an escapement such as decision 21 and loop 22 is in principle optional, it is still nonetheless a good idea. Presumably the probe will subsequently be involved in measuring something in the special mode, and if the special mode were entered with the probe still connected to the special terminal 11 it could produce an undesirable artifact in that measurement, since the signal applied to the probe would be signal present at the special terminal 11 instead of being a work signal of interest in some device under test.

Now assume that location or path 20 in flow chart 12 has been reached. If there is but one special mode of operation 23, it is then entered or performed, at the conclusion of which is path or location 24. Path or location 24 leads back to path or location 13, either directly or through some intervening activity. In the event that there are additional special modes, say, 26 and 27, path 25 represents whatever mechanism selects which one is to be entered. It will be appreciated that this kind of "fan-out" can be accomplished in a variety of ways, including menu selections, key strokes, switch settings, etc., made before or after path 20 is reached. In any event, the optional various alternate special modes 26 and 27 converge to path 28, which in turn leads back to path 24.

Clearly, there is not much to say about detailed activity that would go on inside activities 23, 26 or 27, since the particulars would depend heavily upon what the special modes were. However, it may be noted that if a second instance of touching the probe to the special terminal is to end the special mode, then whatever algorithmic activity in really inside boxes 23, 26 and 27 is responsive to such an event. Yet that does not necessarily mean "in-line" flow charting, so to speak, where a decision is located in a particular spot relative to other actions. (By in-line flow charting we mean conventional old style flow charting where to follow or enact the operation of the flow chart one uses but a single finger; that finger is always someplace on the flow chart and never needs to be more than one place at a time.) It could, of course, be that way, especially if there were but a single processing mechanism, and it was neither multi-tasking nor interrupt driven (single threaded is the term). Once either or both of those techniques is employed, or there are separate processors or state machines for supervising or performing different tasks, an in-line flow chart becomes difficult or misleading to draw. Instead, one would be better off with separate flow charts or ASM charts, with an indication of communication between them. So, for example, in a multi-threaded environment where a second instance of touching the probe to the special terminal 11 cancels the special mode of operation, a supervisory (boss) flow diagram that represents detecting that second instance would simply cause another (worker) flow diagram to either halt execution or follow a different path when that boss flow diagram reached a certain state.

Figure 3:
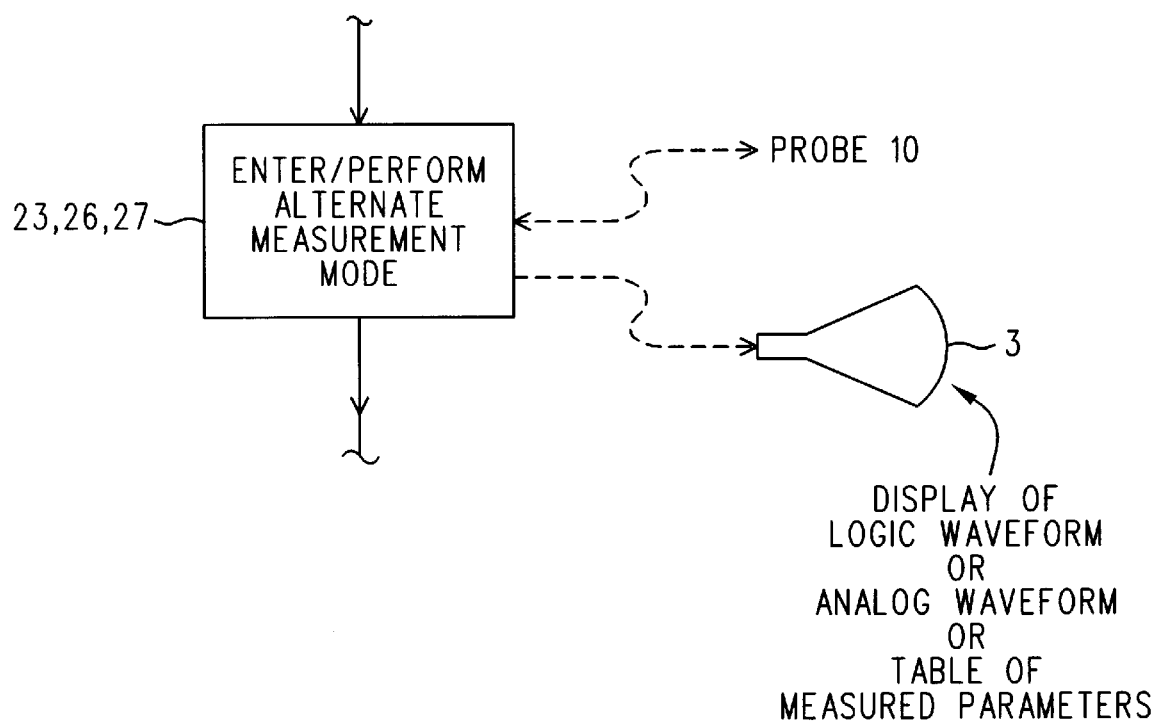
FIG. 3 is a simplified diagram illustrating alternate measurement modes of operation for the system of FIG. 1.

We turn now to a discussion of a number of possible uses to which the ability to automatically select a special mode may be put. These are merely illustrative of a larger number of such uses. In the context of electronic measurement, there are at least five different categories in which an automatically selected alternate mode may fall. The first of these is measurements. As indicated in a general way by FIG. 3, the channel associated with the probe touched to the special terminal may be placed into service for making a type of measurement different from what the majority of other probes are used for. Examples include a single channel oscillographic display of a signal waveform in a logic analyzer. Such a waveform could be a waveform representing an analog signal, or it could be a logic waveform that is quantized to logic levels and constrained to change only at clocked intervals, with annotations to indicated stretched pulses and glitches. Another application of automatic alternate modes of measurement is to simply characterize the measured work signal according to a number of preselected parameters that are of interest, such as rise times, levels of signal swing and frequency of repetition.

A second category concerns configuration. The incorporated document mentions this in part, saying that existing configuration for the channel can be indicated. It is clear that should there be some dissatisfaction with that configuration, it would be possible to change it as well.

Figure 4:
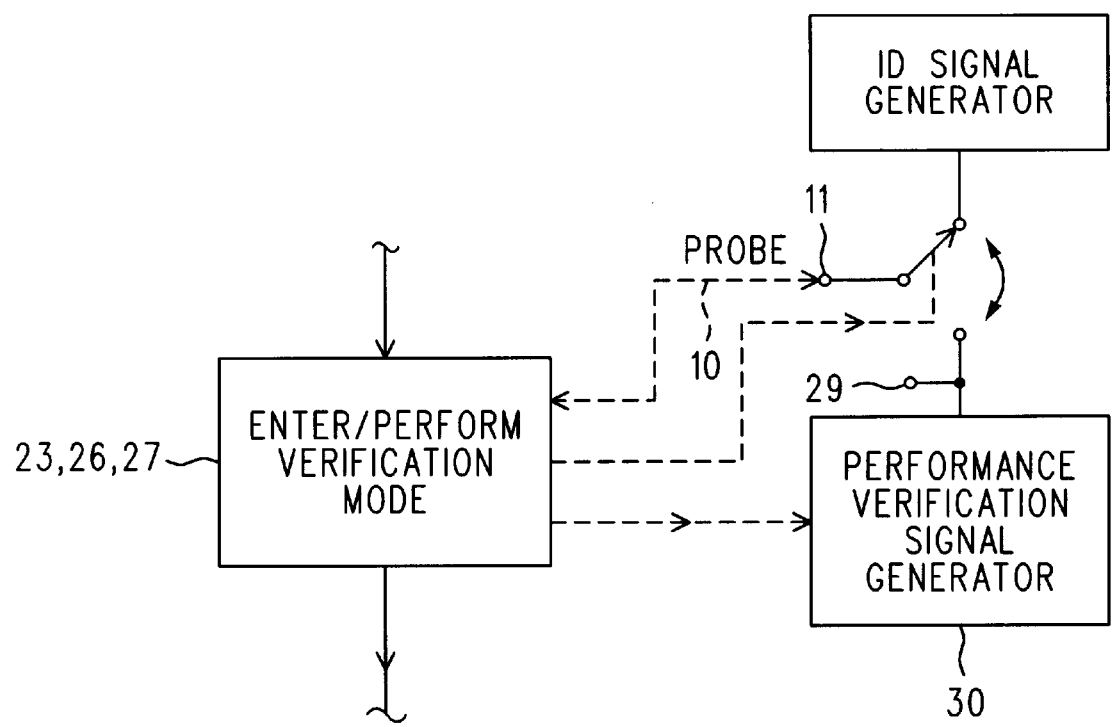
FIG. 4 is a simplified diagram illustrating a performance verification mode of operation for the system of FIG. 1.

A third category involves performance verification, as indicated in a general way by FIG. 4. Something's behavior may cause the user to consider the possibility that there is a malfunction (i.e., some circuit has died). The user's anxiety may include questions such as "I wonder if this channel has gone bananas . . ." To help sort it all out it is helpful if the channel in question can be quickly exercised to verify its performance in key areas of interest, such as rise time, bandwidth, thresholds, etc. Two possibilities come to mind. The first is that the signal applied to the special terminal 11 is already a suitable test signal for such a determination. If it is, then the determination of the channel's integrity can go forward on that basis. On the other hand, it might not be, and either the system replaces the signal on the special terminal with one that is, or the user manually moves the probe to a verification terminal 29 having a signal that is suitable. A performance verification signal generator 30 provides such a suitable signal. There need be nothing mysterious about the performance verification signal generator 30; it is merely one or more circuits that provide one or more signals having certain measurable properties that are known in advance. It may be desirable if the performance verification signal generator 30 were responsive to algorithmic processes of the special mode 23, 26 or 27.

A fourth category is the activation of a help system that would give the user hints about setup or other information about making measurement with that equipment.

Figure 5:
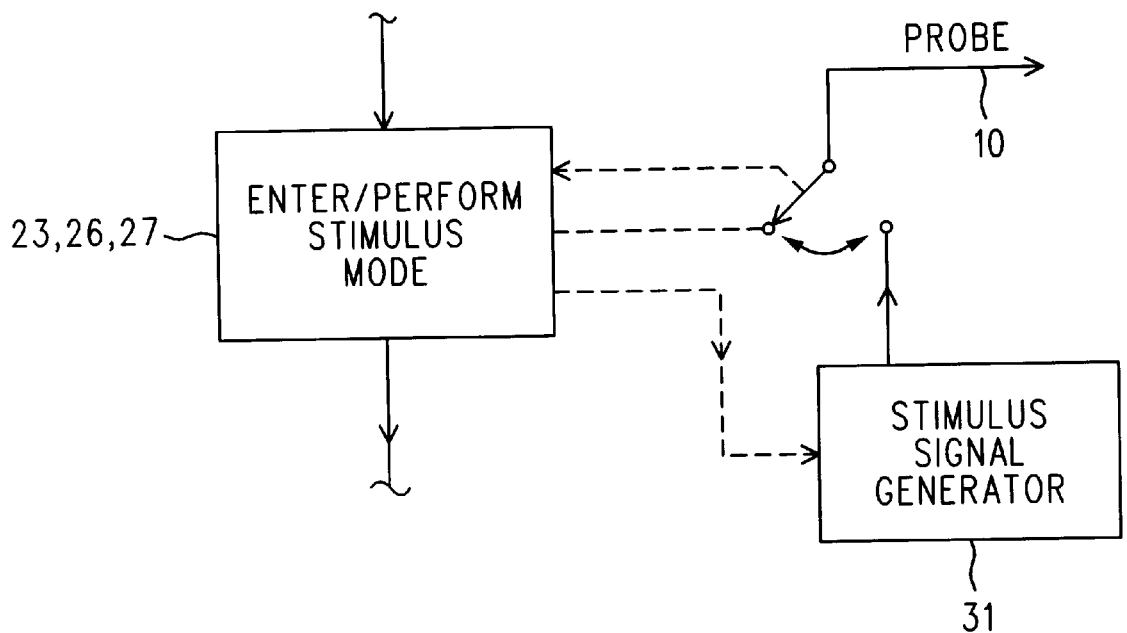
FIG. 5 is a simplified diagram illustrating a stimulus mode of operation for the system of FIG. 1.

A fifth category concerns the establishment of a stimulus mode in equipment that predominately performs measurement. As shown in a general way by FIG. 5, the probe touched to the special terminal becomes the output of a suitable stimulus signal generator 31 and can be used to inject a test signal into a circuit. It may be desirable if the stimulus signal generator 31 were responsive to algorithmic processes within the special mode 23, 26 or 27. One or more other probes and their associated channels can measure the injected signal as it passes through the various stages in the system under test, while the majority of the probes in a multi-channel measurement system remain undisturbed.

I claim:

1. Electronic apparatus having first and second modes of performing measurements and comprising:

a plurality of measurement channels, each measurement channel having an input and an output;

a plurality of probes, each probe of the plurality connected to the input of an associated measurement channel;

a signal generator that produces a first signal unlikely to be identical to a work signal to be measured in a device under test;

a terminal coupled to the first signal and physically accessible by probes within the plurality thereof;

a signal comparison circuit having first and second comparison inputs and a comparison output, the comparison output indicative of whether or not a signal applied to the first comparison input matches one applied to the second comparison input, the first comparison input coupled to the first signal and the second comparison input coupled to the output of at least one measurement channel;

a control circuit coupled to the comparison output and that causes the electronic apparatus to change the mode of performing measurements subsequent to an indication that the signal applied to the second comparison input matches the first signal.

2. Electronic apparatus as in claim 1 wherein the apparatus comprises an analyzer of digital signals and further wherein one of the modes of operation comprises displaying a single channel oscillographic presentation of analog work signal activity for the channel whose associated signal comparison circuit produced a comparison output indicative that the signal applied to the second comparison input matches the first signal.

3. Electronic apparatus as in claim 1 wherein the apparatus comprises an analyzer of digital signals and further wherein one of the modes of operation comprises displaying a single channel logic waveform presentation of digital work signal activity for the channel whose associated signal comparison circuit produced a comparison output indicative that the signal applied to the second comparison input matches the first signal.

4. Electronic apparatus as in claim 1 wherein one of the modes of operation comprises measuring a performance verification signal.

5. Electronic apparatus as in claim 1 wherein one of the modes of operation comprises injecting a test signal into the device under test with a probe previously touched to the terminal.

6. A method of entering an alternate mode of measurement operation in multi-channel electronic test equipment, the method comprising the steps of:

generating a first signal measurable by the multi-channel test equipment;

connecting to a terminal at which the first signal is present a probe associated with a channel of the multi-channel test equipment;

comparing the signal present on each channel with the first signal; and entering the alternate mode of measurement operation in response to a channel having a signal present that is the same as the first signal.

7. A method as in claim 6 further comprising the step of exiting the alternate mode of operation in response to the detection of a subsequent instance of a channel having a signal present that is the same as the first signal.

* * * * *